United States Patent
Yang (10) Patent No.: US 12,127,463 B2
(45) Date of Patent: Oct. 22, 2024

(54) DISPLAY PANEL HAVING SECOND INORGANIC FILM DISPOSED BETWEEN FIRST INORGANIC FILM AND ORGANIC FILM AND METHOD OF MANUFACTURING THE SAME

(71) Applicant: Shenzhen China Star Optoelectronics Semiconductor Display Technology Co., Ltd., Shenzhen (CN)

(72) Inventor: Zongpeng Yang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/619,566

(22) PCT Filed: Nov. 4, 2021

(86) PCT No.: PCT/CN2021/128782
§ 371 (c)(1),
(2) Date: Dec. 15, 2021

(87) PCT Pub. No.: WO2023/070721
PCT Pub. Date: May 4, 2023

(65) Prior Publication Data
US 2024/0049566 A1    Feb. 8, 2024

(30) Foreign Application Priority Data
Oct. 27, 2021 (CN) .......................... 202111257965.5

(51) Int. Cl.
*H10K 59/80* (2023.01)
*H10K 59/12* (2023.01)
*H10K 59/122* (2023.01)

(52) U.S. Cl.
CPC ....... *H10K 59/873* (2023.02); *H10K 59/1201* (2023.02); *H10K 59/122* (2023.02)

(58) Field of Classification Search
CPC ............ H10K 59/873; H10K 59/1201; H10K 59/122; H10K 59/8731; H10K 59/124
(Continued)

(56) References Cited

U.S. PATENT DOCUMENTS

2018/0153006 A1    5/2018   Ishida
2021/0376291 A1*   12/2021  Park ................... H10K 59/8731

FOREIGN PATENT DOCUMENTS

CN    106981584 A    7/2017
CN    107302014 A    10/2017
(Continued)

OTHER PUBLICATIONS

International Search Report in International application No. PCT/CN2021/128782, mailed on Aug. 1, 2022.
(Continued)

*Primary Examiner* — Quoc D Hoang
(74) *Attorney, Agent, or Firm* — PV IP PC; Wei Te Chung (57) ABSTRACT

A display panel and a method of manufacturing the same are provided. In the display panel, a second inorganic film is additionally provided and disposed between the first inorganic film and the organic film, and a gap is formed between the second inorganic film and the bank, so that the surface roughness between the organic film and each of the first inorganic film and the second inorganic film is increased, and binding forces between the adjacent films are increased to prevent the display panel from encountering a film peeling phenomenon in a curling or bending process and increase the yield.

20 Claims, 5 Drawing Sheets

(58) Field of Classification Search
USPC .......................................................... 257/91
See application file for complete search history.

(56) References Cited

FOREIGN PATENT DOCUMENTS

| | | | |
|---|---|---|---|
| CN | 107394058 | A | 11/2017 |
| CN | 108630824 | A | 10/2018 |
| CN | 109461832 | A | 3/2019 |
| CN | 109728200 | A | 5/2019 |
| CN | 110137375 | A | 8/2019 |
| CN | 110299470 | A | 10/2019 |
| CN | 110379935 | A | 10/2019 |
| CN | 110556407 | A | 12/2019 |
| CN | 111081736 | A | 4/2020 |
| CN | 111524908 | A | 8/2020 |
| CN | 111524949 | A | 8/2020 |
| EP | 3719859 | A1 | 10/2020 |

OTHER PUBLICATIONS

Written Opinion of the International Search Authority in International application No. PCT/CN2021/128782, mailed on Aug. 1, 2022.
Chinese Office Action issued in corresponding Chinese Patent Application No. 202111257965.5 dated Oct. 12, 2022, pp. 1-7.

\* cited by examiner

DISPLAY PANEL HAVING SECOND INORGANIC FILM DISPOSED BETWEEN FIRST INORGANIC FILM AND ORGANIC FILM AND METHOD OF MANUFACTURING THE SAME

CROSS-REFERENCE TO RELATED APPLICATION

This application is a national phase application under 35 U.S.C. § 371 of PCT Application No. PCT/CN2021/128782 filed Nov. 4, 2021, which claims priority to Chinese Application No. 202111257965.5 filed Oct. 27, 2021, the contents of which are incorporated herein by reference in their entirety.

FIELD OF INVENTION

This disclosure relates to a technical field of a display, and more particularly to a display panel and a method of manufacturing the same.

BACKGROUND OF INVENTION

Organic light-emitting diode (OLED) displays have been vigorously developed by major display manufacturers because the OLED displays have the advantages including the simple structure, the self light-emitting property, the quick responding speed, the ultra-light and ultra-thin property, the low power consumption and the like. At present, using the OLED display panels in products ranging from small-size mobile phone display screens to large-size flat panel televisions having the high resolution has become a high-end symbol.

A surface of the OLED display panel has a flexible package structure. For the large-size flexible OLED display panel, in order to guarantee the package effect, ensure the completeness of the flexible package structure in a bending or curling process, and prevent the failure caused by the peeling of an organic layer or an inorganic layer as the package area increases, a binding force between the inorganic film and the organic film interface needs to be greater.

At present, the main flexible package structure is a multi-film laminated structure including an inorganic film, an organic film and an inorganic film arranged in order. The organic film is typically formed by a liquid ink through the curing film formation, functions as a planarization and stress relief film, and needs the leveling to achieve the higher thickness uniformity. However, under the influences of the affinity and surface roughness between the organic film and the inorganic film, the binding force at the interface between the inorganic film and the organic film cannot be guaranteed in the existing flexible package structure, and the risk of failure caused by the film peeling is present.

SUMMARY OF INVENTION

Technical Problems

An embodiment of this disclosure provides a display panel and a method of manufacturing the same to solve the problems of film peeling and failure caused by the insufficient binding force between the films of the package structure of the existing display panel.

Technical Solutions

An embodiment of this disclosure provides a display panel including: a substrate including a display area and a non-display area surrounding the display area; at least one bank disposed on a surface of the substrate corresponding to the non-display area, wherein the bank surrounds the display area; a light-emitting unit layer disposed on a surface of the substrate corresponding to the display area; a first inorganic film covering the surface of the substrate corresponding to the display area and covering the light-emitting unit layer; a second inorganic film partially covering a surface of the first inorganic film corresponding to the display area, wherein a gap is present between the second inorganic film and the bank, and the gap exposes at least a portion of the surface of the first inorganic film corresponding to the display area; an organic film being disposed in the display area and covering the second inorganic film, wherein the bank blocks the organic film; and a third inorganic film covering the organic film.

Optionally, one or multiple cavities are disposed on at least one side of the second inorganic film.

Optionally, the cavities are separately arranged along a circumference of the second inorganic film to form a serrate edge of the second inorganic film.

Optionally, numbers of the cavities on two opposite sides of the second inorganic film are the same, and numbers of the cavities on adjacent two sides of the second inorganic film are the same or different from each other.

Optionally, an inner surface of the cavity has a rectangular shape or an arced shape.

Optionally, the second inorganic film includes a main body and at least two projections projectingly disposed on at least one side of the main body, wherein the adjacent two of the projections disposed on a same side and the main body jointly form one of the cavities, and a thickness of the projection is smaller than a thickness of the main body to form a two-stage ladder-shaped cross-sectional structure on the side of the second inorganic film.

Optionally, one end of an upper surface of the projection away from the main body is formed with a notch to form the ladder-shaped cross-sectional structure of the projection, the projection and the main body jointly form the ladder-shaped cross-sectional structure of the second inorganic film having three or more than three stages.

Optionally, there is one projection on the one side of the main body, and a length of the projection is greater than, smaller than or equal to a length of an adjacent side.

Optionally, the first inorganic film extends to the non-display area and covers the bank, and the third inorganic film extends to the non-display area and covers the surface of the first inorganic film in the non-display area.

Optionally, a material of each of first inorganic film, the second inorganic film and the third inorganic film is selected from a group consisting of SiN, SiON and SiO.

An embodiment of this disclosure further provides a method of manufacturing a display panel. The method includes steps of: providing a substrate; forming a light-emitting unit layer in a display area of the substrate; forming a bank in a non-display area of the substrate, wherein the bank surrounds the display area; forming a first inorganic film on a surface of the substrate, wherein the first inorganic film covers the light-emitting unit layer and the bank; forming a second inorganic film on a surface of the first inorganic film corresponding to the display area, wherein the second inorganic film partially covers the first inorganic film, and a gap is formed between the second inorganic film and the bank; forming an organic film on a surface of the second inorganic film, wherein the organic film fills the gap;

and forming a third inorganic film on a surface of the organic film, wherein the third inorganic film covers the organic film.

Useful Effects

Useful effects of this disclosure are described in the following. The provided display panel is configured to additionally provide a second inorganic film disposed between the first inorganic film and the organic film, and to form a gap between the second inorganic film and the bank, and thus to form a ladder-shaped structure between the second inorganic film and the first inorganic film located in the display area, so that subsequently formed contact surface edges between the organic film and the first inorganic film and between the organic film and the second inorganic film form a ladder shape, rather than the plane contact between the organic film and the inorganic film in the existing flexible package structure. Thus, it is possible to increase the surface roughness between the organic film and each of the first inorganic film and the second inorganic film, thereby increasing the binding force between the adjacent films, preventing the display panel from encountering the film peeling phenomenon in the curling or bending process, and improving the yield.

DESCRIPTION OF DRAWINGS

In the following, the technical solutions and other beneficial effects of this disclosure will become obvious by describing the specific implementation embodiments of this disclosure in detail in conjunction with the accompanying drawings.

SYMBOLS

100: display panel; 110: substrate; 110a: display area; 110b: non-display area; 120: bank; 130: light-emitting unit layer; 140: encapsulation layer; 141: first inorganic film; 142: second inorganic film; 142a: main body; 142b: projection; 1421, 1421': cavity; 1422: notch; 143: organic film; 144: third inorganic film.

DETAILED DESCRIPTION OF EMBODIMENTS

In the following, the technical solutions in the embodiments of this disclosure will be clearly and completely described with reference to the accompanying drawings in the embodiments of this disclosure. Obviously, the described embodiments are only a part of the embodiments of this disclosure, rather than all the embodiments. Based on the embodiments of this disclosure, all other embodiments obtained by those skilled in the art without creative works shall be deemed as falling within the protection scope of this disclosure.

The display panel is configured to additionally provide a second inorganic film disposed between a first inorganic film and an organic film, to form a gap between the second inorganic film and a bank, and thus to form a ladder-shaped structure between the second inorganic film and the first inorganic film located in a display area. Thus, subsequently formed contact surface edges between the organic film and the first inorganic film and between the organic film and the second inorganic film form a ladder shape, rather than a plane contact between the organic film and the inorganic film in the existing flexible package structure. Thus, it is possible to increase surface roughness between the organic film and each of the first inorganic film and the second inorganic film, thereby increasing the binding force between the adjacent films, preventing the display panel from encountering the film peeling phenomenon in the curling or bending process, and improving the yield. As a typical application, the display panel functioning as the OLED display screen can be applied to mobile terminals, such as digital cameras, cameras, camcorders, personal digital assistants, smart mobile phones, ultra-thin notebook computers, tablet computers, flexible displays and the like.

Referring to FIGS. 1, 1a, 1b, 2 and 3, a display panel 100 in an embodiment of this disclosure includes a substrate 110, a bank 120, a light-emitting unit layer 130 and an encapsulation layer 140. The substrate 110 includes a display area 110a and a non-display area 110b surrounding the display area 110a. The bank 120 is disposed on a surface of the substrate 110 corresponding to the non-display area 110b, and the bank 120 surrounds the display area 110a. Specifically, the bank 120 has an annular shape, and an inner annular surface of the bank 120 interferes with an edge of the display area 110a.

Figure 1:
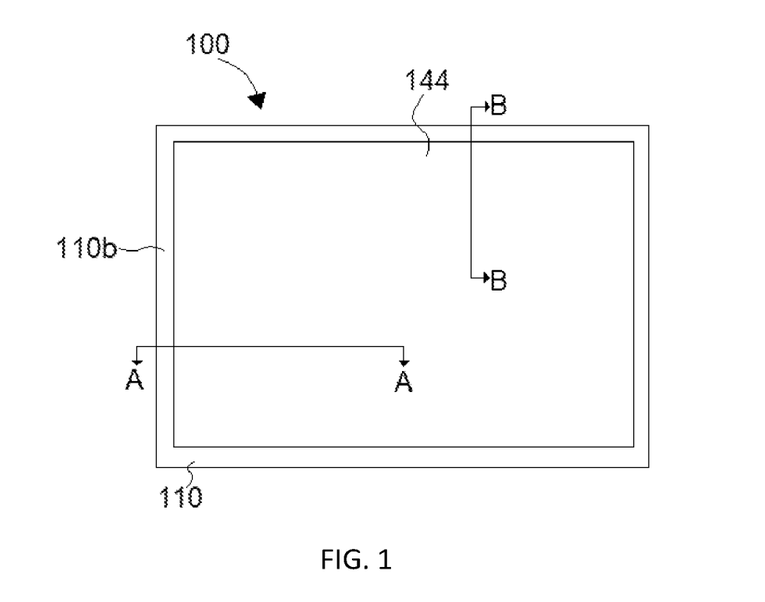
FIG. 1 is a schematic structure view showing a display panel in an exemplary embodiment of this disclosure.
Figure 1A:
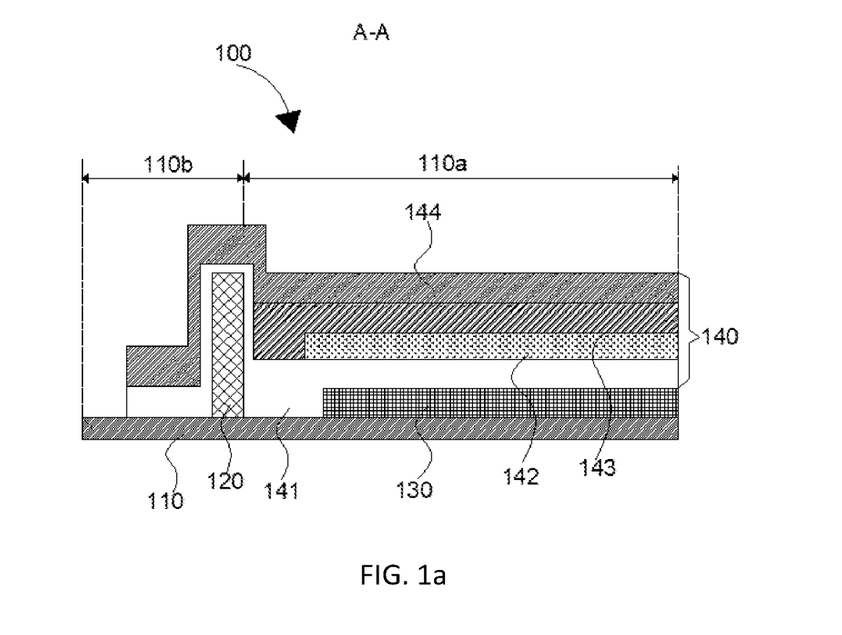
FIG. 1a is a cross-sectional view taken along a line A-A of the display panel shown in FIG. 1.
Figure 1B:
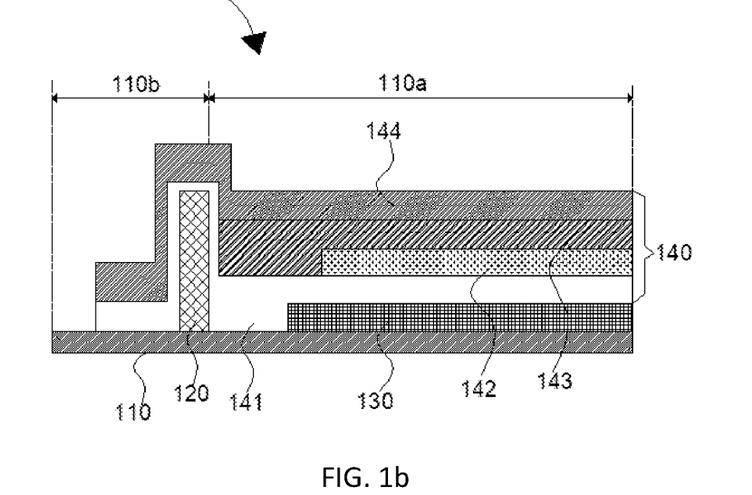
FIG. 1b is a cross-sectional view taken along a line B-B of the display panel shown in FIG. 1

The light-emitting unit layer 130 is disposed on a surface of the substrate 110 corresponding to the display area 110a, and includes an anode layer (not shown in the drawing), an organic electroluminescent layer (not shown in the drawing) and a cathode layer (not shown in the drawing). In this embodiment, the substrate 110 includes a driving unit layer (not shown in the drawing) for driving the light-emitting unit layer 130, and the driving unit layer includes an active layer, a gate insulating layer, a gate metal layer, a source metal layer and a drain metal layer. The anode layer is connected to the drain metal layer to enable the driving unit layer to drive the light-emitting unit layer 130.

Figure 2:
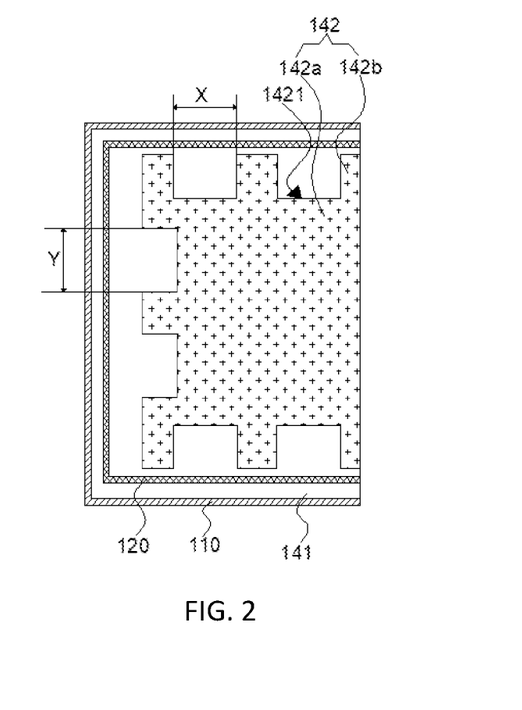
FIG. 2 is a schematic structure top view showing a display panel with a third inorganic film and an organic film being removed in an exemplary embodiment of this disclosure.

The encapsulation layer 140 includes a first inorganic film 141, a second inorganic film 142, an organic film 143 and a third inorganic film 144 disposed in a laminated manner. The first inorganic film 141 covers the display area 110a and the non-display area 110b of the substrate 110. In this embodiment, the first inorganic film 141 covers the light-emitting unit layer 130 located in the display area 110a and covers the bank 120 located in the non-display area 110b. Specifically, in the implementation, the first inorganic film 141 located in the display area 110a covers the cathode layer of the light-emitting unit layer 130. Referring to FIGS. 1 and 2, the second inorganic film 142 covers a partial surface of the first inorganic film 141 located in the display area 110a, a gap is present between the second inorganic film 142 and the bank 120 to expose at least a portion of the surface of the first inorganic film 141 located in the display area 110a, and the second inorganic film 142 does not cover a whole surface of the first inorganic film 141 located in the display area 110a, but is indented by a distance to form the gap between the second inorganic film 142 and the bank 120. In this embodiment, the gap between the edge of the second inorganic film 142 and the inner annular surface of the bank 120 ranges from 100 to 1000 µm, thereby implementing a two-stage ladder-shaped structure between the second inorganic film 142 and the first inorganic film 141. The organic film 143 covers the second inorganic film 142 and fills the gap, and a surface of the organic film 143 away from the second inorganic film 142 is planarized. Because the ladder-shaped structure is formed between the first inorganic film 141 and the second inorganic film 142, the corresponding ladder-shaped structures are also formed on contact surfaces between the organic film 143 and the first inorganic film 141 as well as the second inorganic film 142 to form embedding to increase the roughness of the contact surfaces, and to increase the binding forces at interfaces between the organic film 143 and the first inorganic film 141 as well as the second inorganic film 142. The encapsulation layer 140 is a flexible encapsulation layer. Curling or bending of the display panel 100 occurs at a junction between the display area 110a and the non-display area 110b, and the binding forces near the junctions between the organic film 143 and the first inorganic film 141 as well as the second inorganic film 142 are increased in the this embodiment, thereby preventing the risk of film peeling from occurring in the bending or curling process. In addition, the gap between the second inorganic film 142 and the bank 120 forms a groove structure, and the organic film 143 fills the groove structure and is leveled at the gap, so that the overflow risk can be reduced to a certain extent. Under the precondition of reducing the overflow risk, only one single bank 120 may be provided. Compared with the typical design, the number of the bank can be decreased, thereby further narrowing the border.

The third inorganic film 144 covers the organic film 143, and the third inorganic film 144 extends to the non-display area 110b and covers the first inorganic film 141 located in the non-display area.

In one embodiment, referring to FIG. 2, the indented amounts on sides of the second inorganic film 142 are different, so that multiple cavities 1421 are formed on the sides of the second inorganic film 142, and different gaps between the second inorganic film 142 and the bank 120 are implemented. In this embodiment, the gap between the second inorganic film 142 and the bank 120 is "d" ranging from 100 to 1000 µm, the maximum gap is equal to 1000 µm, and the minimum gap is equal to 100 µm. The cavities 1421 are separately arranged along a circumference of the second inorganic film 142 to form a serrate edge of the second inorganic film 142. In this embodiment, an inner surface of the cavity 1421 has a rectangular shape to form the U-shaped cavity 1421. The numbers of the cavities 1421 formed on one set of opposite sides of the second inorganic film 142 are the same, and a gap X between opposite two inner walls of each cavity 1421 ranges from 20 to 100 µm. The numbers of the cavities 1421 formed on the other set of opposite sides of the second inorganic film 142 are the same, and a gap Y between opposite two inner walls of each cavity 1421 ranges from 20 to 100 µm. The numbers of the cavities 1421 on adjacent two sides of the second inorganic film 142 are different from each other.

Figure 3:
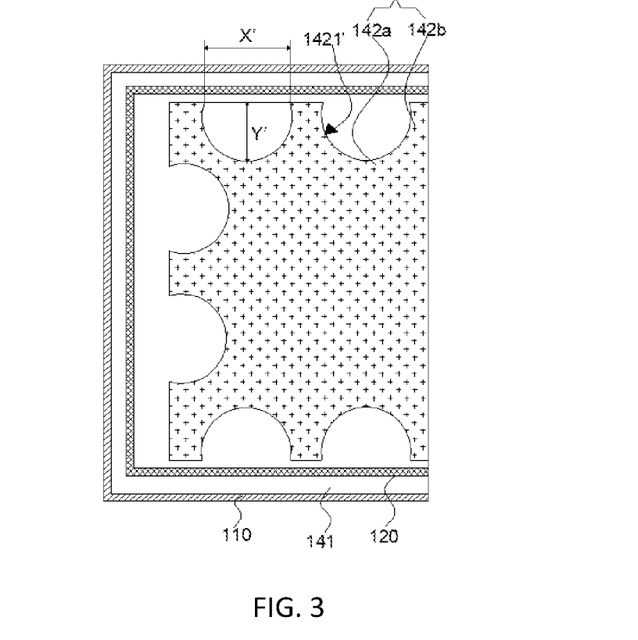
FIG. 3 is a schematic structure top view of a display panel with a third inorganic film and an organic film being removed in an exemplary embodiment of this disclosure.

In one embodiment, referring to FIG. 3, an inner surface of a cavity 1421' has an arced shape to form a concave arced shaped cavity 1421', an inner diameter X' of the open end of the concave arc ranges from 20 to 100 µm, and a depth Y' of the concave arc ranges from 20 to 100 µm.

Figure 4:
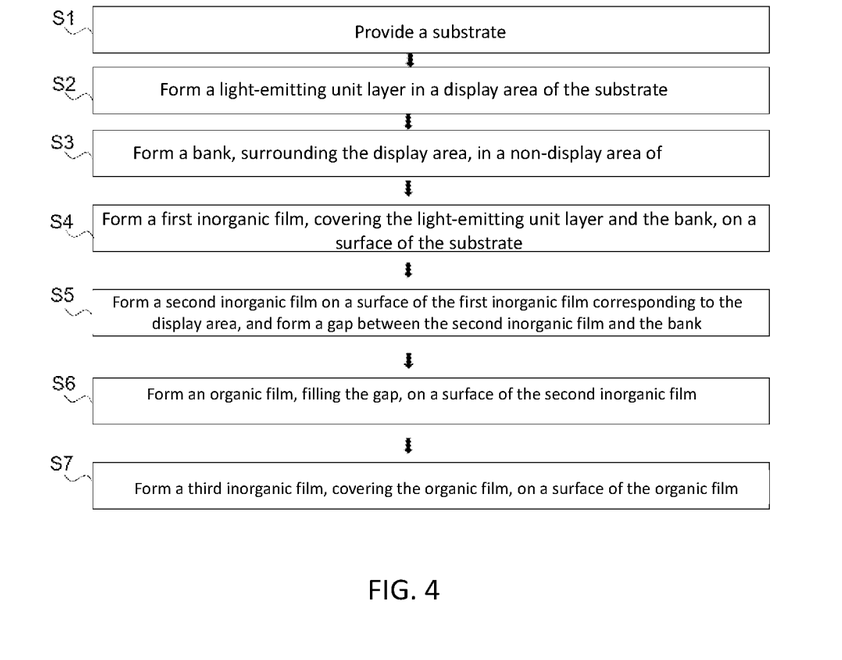
FIG. 4 is a flow chart showing a method of manufacturing the display panel in an exemplary embodiment of this disclosure.

Refer to FIG. 4, a method of manufacturing the display panel 100 of the implementation includes the following steps S1 to S7.

In the step S1, the substrate 110 is provided.

In the step S2, the light-emitting unit layer 130 is formed in the display area 110a of the substrate 110.

In the step S3, the bank 120 is formed in the non-display area 110b of the substrate 110, wherein the bank 120 surrounds the display area 110a.

In the step S4, the first inorganic film 141 is formed on a surface of the substrate 110, wherein the first inorganic film 141 covers the light-emitting unit layer 130 and covers the bank 120.

In the step S5, the second inorganic film 142 is formed on a surface of the first inorganic film 141 corresponding to the display area 110a, wherein the second inorganic film 142 partially covers the first inorganic film 141, and the gap is formed between the second inorganic film 142 and the bank 120.

In the step S6, the organic film 143 is formed on a surface of the second inorganic film 142, wherein the organic film 143 fills the gap.

In the step S7, the third inorganic film 144 is formed on a surface of the organic film 143, wherein the third inorganic film 144 covers the organic film 143.

Specifically, the film formation method of the first inorganic film 141 is the atomic layer deposition (ALD) or the chemical vapor depositing (CVD), and a thickness of the first inorganic film 141 ranges from 0.5 to 1.5 µm. The film formation method of second inorganic film 142 is the ALD or CVD. Upon depositing, a mask having an edge corresponding to the shape of the cavity 1421 or the cavity 1421' can be used to form the second inorganic film 142 having the serrate edge, wherein a thickness of the second inorganic film 142 ranges from 10 nm to 1000 nm. The film formation method of the organic film 143 is ink-jet printing (IJP). In the film formation process, leveling can be performed at the gap between the second inorganic film 142 and the bank 120, wherein a boundary of the organic film 143 is connected to the inner annular surface of the bank 120, and the bank 120 forms a barrier to the organic film 143 to prevent overflow. The film formation method of the third inorganic film 144 is ALD or CVD. The film materials of the first inorganic film 141, the second inorganic film 142 the third inorganic film 144 are selected from a group consisting of SiN, SiON and SiO.

Figure 5:
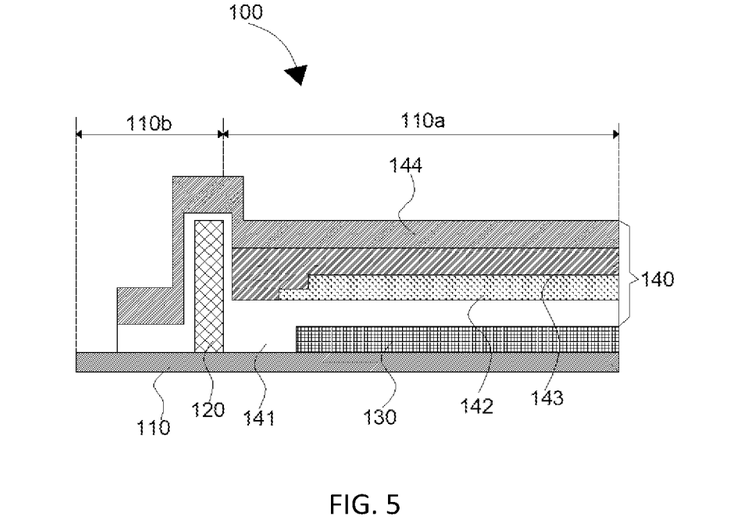
FIG. 5 is a schematic cross-sectional structure view showing a display panel in another exemplary embodiment of this disclosure.
Figure 6:
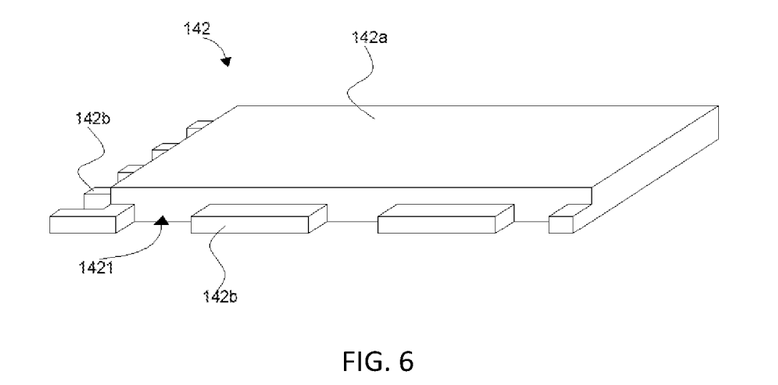
FIG. 6 is a schematic structure view showing a second inorganic film of a display panel in another exemplary embodiment of this disclosure.

As another method of this embodiment, referring to FIGS. 5 and 6, the second inorganic film 142 includes a main body 142a and at least one projection 142b projectingly disposed on at least one side of the main body 142a. The adjacent two of the projections 142b disposed on the same side and the main body 142a jointly form the cavity 1421 or the cavity 1421', and the thickness of the projection 142b is smaller than the thickness of the main body 142a to form a two-stage ladder-shaped structure on the side of the second inorganic film 142.

In this embodiment, after the side of the second inorganic film 142 is indented to form the cavity 1421 or the cavity 1421', structures of the main body 142a and multiple projections 142b projectingly disposed on the sides of the main body 142a can be formed. The cavity 1421 having a rectangular inner surface or the cavity 1421' having an arced inner surface is formed between adjacent two of the projections 142b disposed on the same side. The thicknesses of the projections 142b are smaller than the thickness of the main body 142a, or the thicknesses of at least a portion of the projections 142b are smaller than the thickness of the main body 142a. Therefore, a two-stage ladder-shaped structure of the edge of the second inorganic film 142 is formed, so that a three-stage ladder-shaped structure between the second inorganic film 142 and the first inorganic film 141 is formed to further increase the embedding between the organic film 143 and the first inorganic film 141 as well as the second inorganic film 142, to increase the binding forces, and to avoid the peeling risk from occurring in the curling or bending process. In this embodiment, the thickness of the projection 142b is greater than or equal to 10 nm, and the thickness of the main body 142a is smaller than or equal to 1000 nm. In the film formation method of the second inorganic film 142, the thickness difference between the projection 142b and the main body 142a can be implemented through the structural design of the mask.

Figure 7:
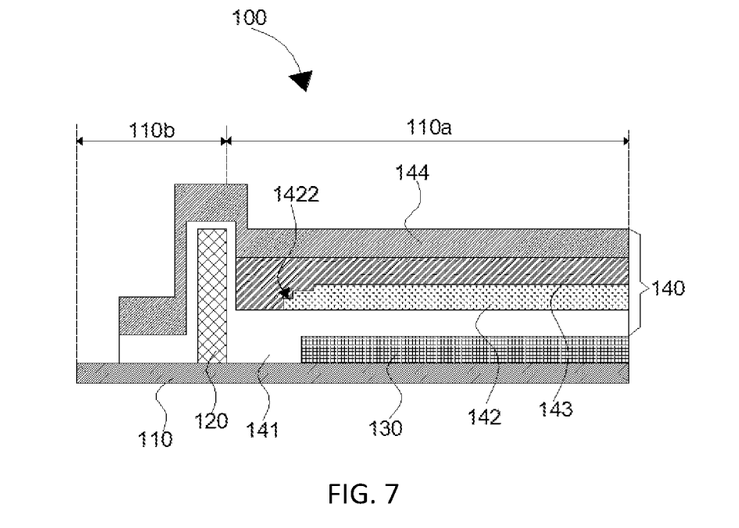
FIG. 7 is a partial schematic cross-sectional structure view showing a display panel in another exemplary embodiment of this disclosure.
Figure 7A:
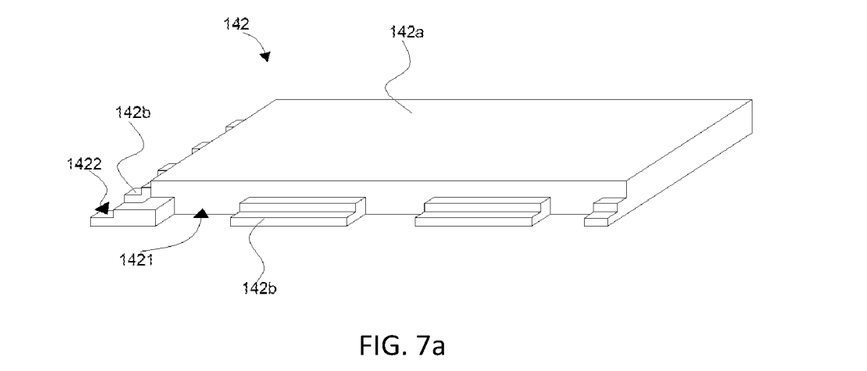
FIG. 7a is a schematic structure view showing the second inorganic film of the display panel shown in FIG. 7.

In one embodiment, referring to FIGS. 7 and 7a, one end of an upper surface of the projection 142b away from the main body 142a is formed with a notch 1422 to form the ladder-shaped cross-sectional structure of the projection 142b, and the projection 142b and the main body 142a jointly form the ladder-shaped cross-sectional structure having three or more than three stages of the second inorganic film 142. In this embodiment, forming the notch 1422 on the projection 142b can make the projection 142b itself form the ladder-shaped structure, and the ladder structure of the projection 142b having two or more than two stages can be formed through the design of multiple stages of notches 1422. In addition, combining with the feature that the thickness of the projection 142b is smaller than the thickness of the main body 142a, the ladder-shaped structure of the second inorganic film 142 having three or more than three stages is formed to increase the embedding between the organic film 143 and the first inorganic film 141 as well as the second inorganic film 142 and to increase the binding forces. As an improved way, a notch is also formed on one end of the main body 142a near the projection 142b to form the ladder-shaped structure of the main body 142a, and thus to form the multi-stage ladder-shaped structure jointly with the projection 142b.

Figure 8:
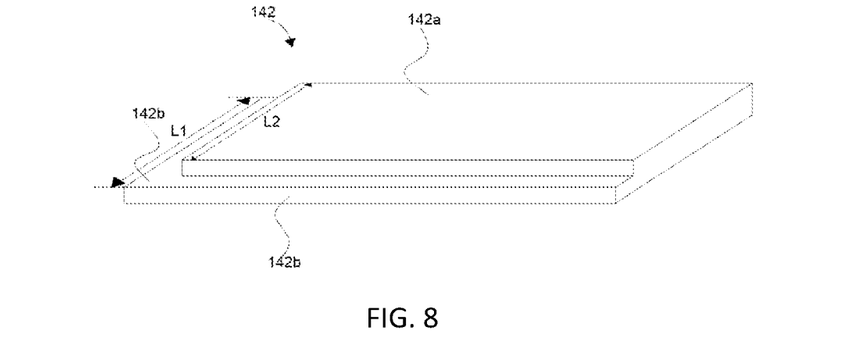
FIG. 8 is a schematic structure view showing the second inorganic film of the display panel in another exemplary embodiment of this disclosure.

In one embodiment, referring to FIG. 8, there is one projection 142b on the one side of the main body 142a, a length L1 of the projection 142b is greater than, smaller than or equal to a length L2 of an adjacent side. In this embodiment, there is one projection 142b on the at least one side of the main body 142a, wherein the side of the second inorganic film 142 does not have the cavity design, but the ladder-shaped cross-sectional structure of the second inorganic film 142 is reserved. Referring to FIG. 8, the projection 142b is disposed in a lengthwise direction of the adjacent side, and the length L1 of the projection 142b is greater than the length L2 of the adjacent side. In other embodiments, the length L1 of the projection 142b is smaller than or equal to the length L2 of the adjacent side.

In summary, although this disclosure has been described in the above-mentioned preferred embodiments, the above-mentioned preferred embodiments are not intended to limit this disclosure. Various modifications and decorations may be made by those of ordinary skill in the art without departing from the spirit and scope of this disclosure. Therefore, the protection scope of this disclosure is subject to the scope defined by the claims.

What is claimed is:

1. A display panel, comprising:
   a substrate comprising a display area and a non-display area surrounding the display area;
   at least one bank disposed on a surface of the substrate corresponding to the non-display area, wherein the bank surrounds the display area;
   a light-emitting unit layer disposed on a surface of the substrate corresponding to the display area;
   a first inorganic film covering the surface of the substrate corresponding to the display area and covering the light-emitting unit layer;
   a second inorganic film partially covering a surface of the first inorganic film corresponding to the display area, wherein a gap is present between the second inorganic film and the bank, and the gap exposes at least a portion of the surface of the first inorganic film corresponding to the display area;
   an organic film being disposed in the display area and covering the second inorganic film; and
   a third inorganic film covering the organic film.

2. The display panel according to claim 1, wherein one or multiple cavities are disposed on at least one side of the second inorganic film.

3. The display panel according to claim 2, wherein there are multiple cavities, and the cavities are separately arranged along a circumference of the second inorganic film to form a serrate edge of the second inorganic film.

4. The display panel according to claim 3, wherein numbers of the cavities on two opposite sides of the second inorganic film are the same, and numbers of the cavities on adjacent two sides of the second inorganic film are the same or different from each other.

5. The display panel according to claim 4, wherein an inner surface of the cavity has a rectangular shape.

6. The display panel according to claim 4, wherein an inner surface of the cavity has an arced shape.

7. The display panel according to claim 4, wherein the second inorganic film comprises a main body and at least two projections projectingly disposed on at least one side of the main body, the adjacent two of the projections disposed on a same side and the main body jointly form one of the cavities, and a thickness of the projection is smaller than a thickness of the main body to form a two-stage ladder-shaped cross-sectional structure on the side of the second inorganic film.

8. The display panel according to claim 7, wherein one end of an upper surface of the projection away from the main body is formed with a notch to form the ladder-shaped cross-sectional structure of the projection, the projection and the main body jointly form the ladder-shaped cross-sectional structure of the second inorganic film having three or more than three stages.

9. The display panel according to claim 8, wherein there is one projection on the one side of the main body, and a length of the projection is greater than a length of an adjacent side.

10. The display panel according to claim 8, wherein there is one projection on the one side of the main body, and a length of the projection is smaller than a length of an adjacent side.

11. The display panel according to claim 8, wherein there is one projection on the one side of the main body, and a length of the projection is equal to a length of an adjacent side.

12. The display panel according to claim 1, wherein the first inorganic film extends to the non-display area and covers the bank, and the third inorganic film extends to the non-display area and covers the surface of the first inorganic film in the non-display area.

13. The display panel according to claim 1, wherein a material of the first inorganic film is selected from a group consisting of SiN, SiON and SiO.

14. The display panel according to claim 1, wherein a material of the second inorganic film is selected from a group consisting of SiN, SiON and SiO.

15. The display panel according to claim 1, wherein a material of the third inorganic film is selected from a group consisting of SiN, SiON and SiO.

16. A method of manufacturing a display panel, the method comprising steps of:
providing a substrate;
forming a light-emitting unit layer in a display area of the substrate;
forming a bank in a non-display area of the substrate, wherein the bank surrounds the display area;
forming a first inorganic film on a surface of the substrate, wherein the first inorganic film covers the light-emitting unit layer and the bank;
forming a second inorganic film on a surface of the first inorganic film corresponding to the display area, wherein the second inorganic film partially covers the first inorganic film, and a gap is formed between the second inorganic film and the bank;
forming an organic film on a surface of the second inorganic film, wherein the organic film fills the gap; and
forming a third inorganic film on a surface of the organic film, wherein the third inorganic film covers the organic film.

17. The method according to claim 16, wherein the step of forming the second inorganic film on the surface of the first inorganic film corresponding to the display area further comprises: forming one or multiple cavities on at least one side of the second inorganic film.

18. The method according to claim 17, wherein when the second inorganic film is formed, the second inorganic film is deposited using a mask having an edge corresponding to a shape of the cavity to form the cavity on the side of the second inorganic film.

19. The method according to claim 18, wherein the second inorganic film comprises a main body and multiple projections projectingly disposed on one side of the main body, one of the cavities is formed between adjacent two of the projections on a same side, and the mask is configured such that a deposited thickness of the projection is smaller than a deposited thickness of the main body.

20. The method according to claim 18, wherein the second inorganic film comprises a main body and a projection projectingly disposed on at least one side of the main body, and the mask is configured such that a deposited thickness of the projection is smaller than a deposited thickness of the main body.

* * * * *